(12) United States Patent
Yamamoto

(10) Patent No.: US 7,019,790 B2
(45) Date of Patent: Mar. 28, 2006

(54) INTEGRATED TUNER CIRCUIT AND TELEVISION TUNER USING AN INTEGRATED TUNER CIRCUIT

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 514 days.

(21) Appl. No.: 10/341,695

(22) Filed: Jan. 13, 2003

(65) Prior Publication Data
US 2003/0133047 A1    Jul. 17, 2003

(30) Foreign Application Priority Data
Jan. 15, 2002  (JP) .............................. 2002-006080
Feb. 8, 2002   (JP) .............................. 2002-031879

(51) Int. Cl.
H04N 5/44   (2006.01)
H04N 5/50   (2006.01)
H03J 5/00   (2006.01)
H04B 1/16   (2006.01)
H04B 1/18   (2006.01)
H04B 1/26   (2006.01)

(52) U.S. Cl. ....................... 348/725; 348/733; 348/735; 334/47; 455/180.2; 455/188.2; 455/195.1; 455/196.1

(58) Field of Classification Search ........ 348/731–733, 348/735, 725; 455/180.1–180.4, 188.1–188.2, 455/189.1, 190.1, 191.1, 195.1, 196.1; 334/47; H04N 5/44, 5/50; H03J 5/00; H04B 1/16, H04B 1/18, 1/24
See application file for complete search history.

(56) References Cited

U.S. PATENT DOCUMENTS

| | | | | |
|---|---|---|---|---|
| 5,737,035 A | * | 4/1998 | Rotzoll | 348/725 |
| 6,108,050 A | * | 8/2000 | Yamamoto et al. | 348/731 |
| 6,177,964 B1 | * | 1/2001 | Birleson et al. | 348/725 |
| 6,243,567 B1 | * | 6/2001 | Saito | 455/188.2 |
| 6,392,715 B1 | * | 5/2002 | Sato et al. | 348/731 |
| 6,903,783 B1 | * | 6/2005 | Yamamoto | 348/731 |
| 2003/0112377 A1 | * | 6/2003 | Kawamura et al. | 348/731 |
| 2003/0137608 A1 | * | 7/2003 | Yamamoto | 348/731 |

FOREIGN PATENT DOCUMENTS

| | | |
|---|---|---|
| DE | 198 11 104 A1 | 9/1999 |
| EP | 899 877 A1 | 3/1999 |
| EP | 905 891 A1 | 3/1999 |
| EP | 911 960 A1 | 4/1999 |
| GB | 2 260 455 A | 4/1993 |
| JP | 6-283973 | 10/1994 |

* cited by examiner

*Primary Examiner*—Brian Yenke
(74) *Attorney, Agent, or Firm*—Brinks Hofer Gilson & Lione

(57) ABSTRACT

An integrated tuner circuit includes a first terminal to which a UHF TV signal is input via a UHF amplifier. The amplifier is switched to an operating state when a UHF TV signal is received. A switching-voltage generation circuit includes a first switching circuit for generating a switching voltage used to switch the operating state of a UHF high-frequency amplifying circuit. The switching voltage of the first switching circuit is output to the first terminal

21 Claims, 6 Drawing Sheets

INTEGRATED TUNER CIRCUIT AND TELEVISION TUNER USING AN INTEGRATED TUNER CIRCUIT

BACKGROUND OF THE INVENTION

1. Field of the Invention

The present invention-relates to an integrated tuner circuit and to a television tuner using the integrated tuner circuit.

2. Description of the Related Art

The circuit configuration and the terminal arrangement of a conventional integrated tuner circuit (hereinafter referred to as an "integrated circuit"), and the connection relationships with peripheral circuits thereof are shown in FIG. 4. As shown in FIG. 4, a conventional integrated circuit 60 has 16 terminals for each of the two opposing sides (numerals within white circles represent terminal numbers (No.)).

Terminals No. 1 to No. 16 are provided for one of the sides 60a, and terminals No. 17 to No. 32 are provided for the other side 60b. Inside the integrated circuit 60, a plurality of circuits are formed, as generally shown in FIG. 4A balanced input end of a UHF mixer circuit 61 is connected to terminals Nos. 31 and 32, and an input end of a VHF mixer circuit 62 is connected to terminal No. 29. The balanced output ends of each of the mixer circuits 61 and 62 are connected to terminals Nos. 26 and 27.

Local oscillation signals are supplied to the VHF mixer circuit 62 from two oscillation circuits 63 and 64. A VHF low-band oscillation circuit 63 has two differential oscillation transistors 63a and 63b, the base of one of the oscillation transistors 63a is connected to terminal No. 1, and the collector of the other oscillation transistor 63b is connected to terminal No. 2. A VHF high-band oscillation circuit 64 also has two differential oscillation transistors 64a and 64b, the base of one of the oscillation transistors 64a is connected to terminal No. 4, and the collector of the other oscillation transistor 64b is connected to terminal No. 5.

A local oscillation signal is supplied from a UHF oscillation circuit 65 to the UHF mixer circuit 61. The UHF high-band oscillation circuit 65 also has two differential oscillation transistors 65a and 65b, the base of one of the oscillation transistors 65a is connected to terminal No. 6, and the collector thereof is connected to terminal No. 8. The base of the other oscillation transistor 65b is connected to terminal No. 9, and the collector thereof is connected to terminal No. 7.

Data for selecting a channel to be received is input from the main unit of a television receiver (not shown) to terminals Nos. 17 to 19. More specifically, a clock signal is input to terminal No. 17, channel selection data and band switching data are input to terminal No. 18, and address data is input to terminal No. 19. The above data is input to a PLL circuit 67 and a band-switching-voltage generation circuit 68 via an interface 66. A local oscillation signal is input to the PLL circuit 67 from each of the oscillation circuits 63, 64, and 65. An error signal output from the PLL circuit 67 is DC-converted by a charge pump 69 having a low-pass filter, and then a tuning voltage is output from a tuning-voltage generation circuit 70 to terminal No. 15. Furthermore, a reference signal is input to the PLL circuit 67 from a reference oscillation circuit 71. The oscillation connection end of the reference oscillation circuit 71 is connected to terminal No. 16.

The band-switching-voltage generation circuit 68 has therein a plurality of switching circuits, so that each switching circuit generates a high-level or low-level switching voltage in accordance with the input data. This switching voltage is used to switch the band to be received, and is output to each of terminals Nos. 20, 23 to 25, and 30.

A balanced type intermediate-frequency amplifying circuit 72 has two input ends connected to terminals Nos. 21 and 22, and two output ends connected to terminals Nos. 11 and 12.

Terminals Nos. 3, 10, and 28 are grounded, and a power-supply voltage B to be supplied to each circuit is applied to terminal No. 13.

Peripheral circuits connected to the integrated circuit 60 are externally provided. A television signal of a UHF band is input in a balanced manner to terminals Nos. 31 and 32 after passing through a UHF high-frequency amplifying circuit 73 and a UHF tuning circuit 74. A television signal of a VHF band is input to terminal No. 29 after passing through a VHF tuning circuit 75. The VHF tuning circuit 75 has therein a switching diode 75a, so that it tunes to a low band or a high band in accordance with the on/off state of the switching diode. The input ends of an intermediate-frequency tuning circuit 76 are connected to terminals Nos. 26 and 27, and the output ends thereof are connected to terminals Nos. 21 and 22.

A low-band resonance circuit 77 has a varactor diode 77a, one end thereof is coupled to terminals Nos. 1 and 2 via coupling capacitors 78 and 79, respectively, and the other end is grounded. A high-band resonance circuit 80 also has a varactor diode 80a, one end thereof is coupled to terminals Nos. 4 and 5 via coupling capacitors 81 and 82, respectively. Furthermore, a UHF resonance circuit 83 also has a varactor diode 83a, one end thereof is coupled to terminals Nos. 6 and 7 via coupling capacitors 84 and 85, respectively, and the other end is coupled to terminals Nos. 8 and 9 via corresponding coupling capacitors. An oscillation element 88, such as a crystal resonator, is connected to terminal No. 16.

In the above-described configuration, the tuning voltage output from terminal No. 15 is applied to the cathode of each of the varactor diodes 77a, 80a and 83a of the resonance circuits 77, 80 and 83, and the oscillation circuits 63 to 65 oscillate at a frequency necessary for their receiving band. The switching voltages output from terminals Nos. 23 and 24 are applied to the VHF tuning circuit 75, whereby the switching diode 75a is turned on or off. When the switching diode 75a is off, the VHF tuning circuit 75 tunes to the low band of the VHF band, and when the switching diode 75a is on, the VHF tuning circuit 75 tunes to the high band. Furthermore, the switching voltage output from terminal No. 30 is applied to the UHF high-frequency amplifying circuit 73. When a television signal of a UHF band is to be received, the switching voltage reaches a high level, causing the UHF high-frequency amplifying circuit 73 to operate at an appropriate bias state, and when a television signal of a VHF band is to be received, the switching voltage reaches a low level, causing the UHF high-frequency amplifying circuit 73 to stop operating.

In the manner described above, an intermediate-frequency signal is output from each of the mixer circuits 61 and 62 in such a manner as to correspond to each band to be received, and is output in a balanced manner to terminals Nos. 11 and 12 after passing through the intermediate-frequency tuning circuit 76 and the intermediate-frequency amplifying circuit 72. The output intermediate-frequency signal IF is processed by a demodulation circuit (not shown), etc.

Referring to FIG. 6, a description will now be given of the configuration of another conventional integrated tuner circuit and a television tuner using the integrated tuner circuit.

FIG. 6 shows a television tuner to which, in particular, a television signal of a UHF band is input. An input tuning circuit 131 to which a television signal is input has a varactor diode (not shown), and a tuning voltage V is applied to the varactor diode. An FET (dual-gate FET) 132 which is a constituent of a high-frequency amplifying circuit is provided in a portion subsequent to the input tuning circuit 131, and the output end of the input tuning circuit 131 is coupled to a first gate of the FET 132.

One end of an inductance element 133 is connected to the first gate of the FET 132, and the other end is grounded at a high frequency by a DC-blocking capacitor 134 and is also grounded by a resistor 135. The source of the FET 132 is grounded, and a power-supply voltage B is applied to the drain thereof via a series circuit of a power-feeding resistor 136 and a choke inductor 137. The connection point of the power-feeding resistor 136 and the choke inductor 137 is grounded by a DC-blocking capacitor 138.

A double tuning circuit 139 is provided at the next stage of the FET 132. A parallel tuning circuit on the primary side thereof is formed of a varactor diode 139a and an inductance element 139b, and the connection point of the anode of the varactor diode 139a and the inductance element 139b, which is a high electrical-potential point, is coupled to the drain of the FET 132 via a coupling capacitor 140. The cathode of the varactor diode 139a is grounded by a DC-blocking capacitor 139c, and the other end of the inductance element 139b is also grounded. Then, a tuning voltage V is applied to the cathode of the varactor diode 139a.

A parallel tuning circuit on the secondary side in the double tuning circuit 139 is formed of a varactor diode 139d and an inductance element 139e, and the connection point of the anode of the varactor diode 139d and the inductance element 139e, which is a high electrical-potential point, is coupled to a first terminal 142a of an integrated tuner circuit (hereinafter referred to simply as an "integrated circuit") 142 via a coupling capacitor 141. The cathode of the varactor diode 139d is grounded by a DC-blocking capacitor 139f, and the other end of the inductance element 139e is also grounded. Then, a tuning voltage V is applied to the cathode of the varactor diode 139d.

A mixer circuit 143 for converting the frequency is formed inside the integrated circuit 142. The mixer circuit 143 is formed as a balanced type, and their emitters are connected to each other. Also, the mixer circuit 143 has two transistors 143a and 143b whose bases are input ends, the base of one of the transistors 143a is connected to the first terminal 142a, and the base of the other transistor 143b is connected to the second terminal 142b. A bias voltage is applied to the bases of the two transistors 143a and 143b inside the integrated circuit 142. Furthermore, diodes 143e and 143d for preventing electrostatic breakdown, formed in the integrated circuit 142, are connected to the corresponding bases.

Furthermore, a band-switching-voltage generation circuit 144 is formed inside the integrated circuit 142. Data D of a channel to be received is input to the band-switching-voltage generation circuit 144, and a high (approximately equal to the power-supply voltage B) and a low (approximately 0 volts or an open state) switching voltage for selecting a band belonging to that channel in accordance with the data D is generated. The switching voltage reaches a high level, for example, when a television signal of a channel in the UHF band, which is a high frequency band, is received, and reaches a low level when a television signal of a channel in the VHF band, which is a low frequency band, is received.

The output end of the band-switching-voltage generation circuit 144 is connected to a third terminal 143c.

The first terminal 142a and the second terminal 142b are connected to each other through an inductance element 145. Furthermore, the third terminal 143c is connected to the connection point of the inductance element 133 and the resistor 135 through a resistor 146.

Furthermore, the tuning voltage V to be applied to the input tuning circuit 131 and the double tuning circuit 139 is preferably generated from the integrated circuit 142.

In the above-described configuration, when a television signal of a UHF band is to be received, the switching voltage becomes high, an appropriate bias voltage is applied to the first gate of the FET 132, and the FET 132 operates normally. The television signal which is amplified by the FET 132 and is then selected by the double tuning circuit 139 is converted in a balanced manner by the inductance element 145, and is input to the first terminal 142a and the second terminal 142b of the integrated circuit 142.

When a television signal of the VHF band is to be received, the switching voltage becomes low, a bias voltage is not applied to the first gate of the FET 132, and the FET 132 is placed in a non-operating state.

In the above-described conventional integrated circuit, many terminals are used so that a resonance circuit is coupled to an oscillation circuit. The number of terminals for extracting a switching voltage from the band-switching-voltage generation circuit is great, and the number of terminals to be grounded is great. For this reason, the connection with peripheral circuits is complex, and the size of the integrated circuit itself cannot be reduced. Furthermore, the size of the television tuner which uses the integrated circuit cannot be reduced.

In the above-described configuration shown in FIG. 6, a switching voltage is used to switch the FET 132 between the operating state and the non-operating state. For this purpose, a dedicated third terminal 142c is provided in the integrated circuit 142. In order to reduce the size of the integrated circuit 142, a reduction in the number of terminals is an important task.

SUMMARY OF THE INVENTION

This disclosure relates techniques that can be used to form necessary circuits inside an integrated circuit and to reduce the number of terminals.

This disclosure also techniques of extracting a switching voltage without providing a dedicated terminal for outputting a switching voltage for switching bands to be received.

Further, the disclosure indicates an approach to simplify the configuration of a television tuner by using the above-described integrated tuner circuit.

In one aspect, the this disclosure describes an integrated tuner circuit with various components, including a switching-voltage generation circuit and a first terminal. Through the first terminal, the switching-voltage generation circuit receives a television signal of a UHF band via an external UHF high-frequency amplifying circuit. The amplifying circuit is switched to an operating state at least when a television signal of a UHF band is, received. A second terminal is used for switching the band so that an external VHF tuning circuit tunes to a low band or a high band of a VHF band. The switching-voltage generation circuit includes one switching circuit that generates a voltage for switching the operating state of the UHF high-frequency amplifying circuit, and a second switching circuit that generates a voltage for switching the band of the VHF tuning circuit. The switching voltage of the first switching circuit is output to the first terminal, and the switching voltage of the second switching circuit is output to the second terminal. With this reduced number of terminals, one implementation of the circuit receives a low band and a high band of a VHF band, and a UHF band.

The integrated tuner circuit may further include a first, a second, and a third pair of oscillation transistors, with the emitters in each pair connected to each other. A third terminal is connected to one end of a first resonance circuit. A fourth and a fifth terminal are connected to the two ends of an external second resonance circuit. A sixth and a seventh terminal are connected to two ends of an external third resonance circuit. . . . The base of one of the transistors in the first pair of oscillation transistors and the collector of the other first oscillation transistor are coupled to the third terminal by corresponding coupling capacitors. The base of one of the two second-pair oscillation transistors and the collector of the other second-pair oscillation transistor are coupled to the fourth terminal by corresponding coupling capacitors. The base of the other second-pair oscillation transistor and the collector of the one of the two second-pair oscillation transistors are coupled to the fifth terminal by corresponding coupling capacitors. The base of one of the two third oscillation transistors and the collector of the other third oscillation transistor are coupled to the sixth terminal by corresponding coupling capacitors, and the base of the other second oscillation transistor and the collector of the one of the two second oscillation transistors are coupled to the seventh terminal by corresponding coupling capacitors. In a preferred configuration, this arrangement is employed to form three oscillation circuits with a reduced number of terminals.

The integrated tuner circuit may further include: an intermediate-frequency amplifying circuit; and an eighth terminal for outputting an intermediate-frequency signal, wherein the intermediate-frequency amplifying circuit is formed as a balanced input type and an unbalanced output type, and the output end of the intermediate-frequency amplifying circuit is connected to the eighth terminal.

The integrated tuner circuit may, further include: a ninth terminal to which a balanced output end of an intermediate-frequency tuning circuit is connected. The intermediate-frequency tuning circuit comprises a trapping circuit for attenuating a video intermediate-frequency signal or an audio intermediate-frequency signal of an adjacent channel and is configured so that the trapping frequency of the trapping circuit is modified. The switching-voltage generation circuit includes a third switching circuit for generating a switching voltage used to change the trapping frequency, and the switching voltage of the third switching circuit is output to the ninth terminal. This arrangement is used in a preferred configuration to modify the trapping frequency without increasing the number of terminals.

The integrated tuner circuit may further include: an analog-to-digital conversion circuit; and a tenth terminal for inputting an analog signal to the analog-to-digital conversion circuit, wherein the switching-voltage generation circuit comprises a fourth switching circuit for outputting a high-level or a low-level voltage, and opening/closing means interposed between the tenth terminal and the fourth switching circuit. The opening/closing means is opened when the analog-to-digital conversion circuit is made to operate, and the opening/closing means is closed when the fourth switching circuit is made to operate. One terminal is then preferably used as an input terminal for an analog voltage and an output terminal for the switching voltage.

The integrated tuner circuit may further include: a PLL circuit; a reference oscillation circuit for supplying a reference signal to the PLL circuit; and an eleventh terminal by which an external oscillation element is connected to the reference oscillation circuit. Terminals which reach a low electrical potential at a high frequency are provided on both sides of the eleventh terminal. The radiation of the reference signal which appears at the eleventh terminal is preferably blocked by terminals on both sides.

In another aspect, the integrated tuner circuit includes: a mixer circuit for converting a television signal into an intermediate-frequency signal; a terminal to which the television signal is input; and a band-switching-voltage generation circuit for generating a high or a low switching voltage for receiving a high-frequency or a low-frequency television signal. An input end of the mixer circuit is connected at a high frequency to the terminal, and the switching voltage is applied to the terminal via a resistor.

The mixer circuit preferably comprises two transistors formed as a balanced type in which the bases are input ends, two of the terminals are provided, the bases of the transistors are connected to the terminals via corresponding capacitor elements, and the switching voltage is applied to one of the terminals. The terminal to which a television signal is input and the terminal from which a switching voltage is output are preferably shared, thereby reducing the number of terminals.

In another aspect, the television tuner includes: an integrated tuner circuit; an amplifying field-effect transistor, to the gate of which a television signal is input; and a tuning circuit connected to the drain of the field-effect transistor. An output end of the tuning circuit is coupled to the terminal of the integrated tuner circuit, and the gate is DC-connected to the terminal. The operation of the field-effect transistor is preferably switched in accordance with the switching voltage output to the terminal coupled to the mixer circuit, thereby simplifying the configuration of the tuner.

In another aspect, the television tuner includes: an integrated tuner circuit; an amplifying field-effect transistor, to the gate of which a television signal is input; and a tuning circuit connected to the drain of the field-effect transistor. The output end of the tuning circuit is coupled to the other terminal of the integrated tuner circuit, one of the terminals and the other terminal are connected to each other by an inductance element, and the gate is DC-connected to the one terminal. A balanced television signal can be preferably input to the balanced mixer circuit, and the field-effect transistor can be switched.

In yet another embodiment of the television tuner, the tuning circuit comprises a double tuning circuit, the gate and the other terminal are connected to each other by a resistor, and a stray capacitance is formed between the resistor and the high electrical-potential side of the tuning circuit on the primary side in the double tuning circuit. A trapping circuit is formed, and image interference can be eliminated by the trapping circuit.

DESCRIPTION OF THE PREFERRED EMBODIMENTS

Figure 1:
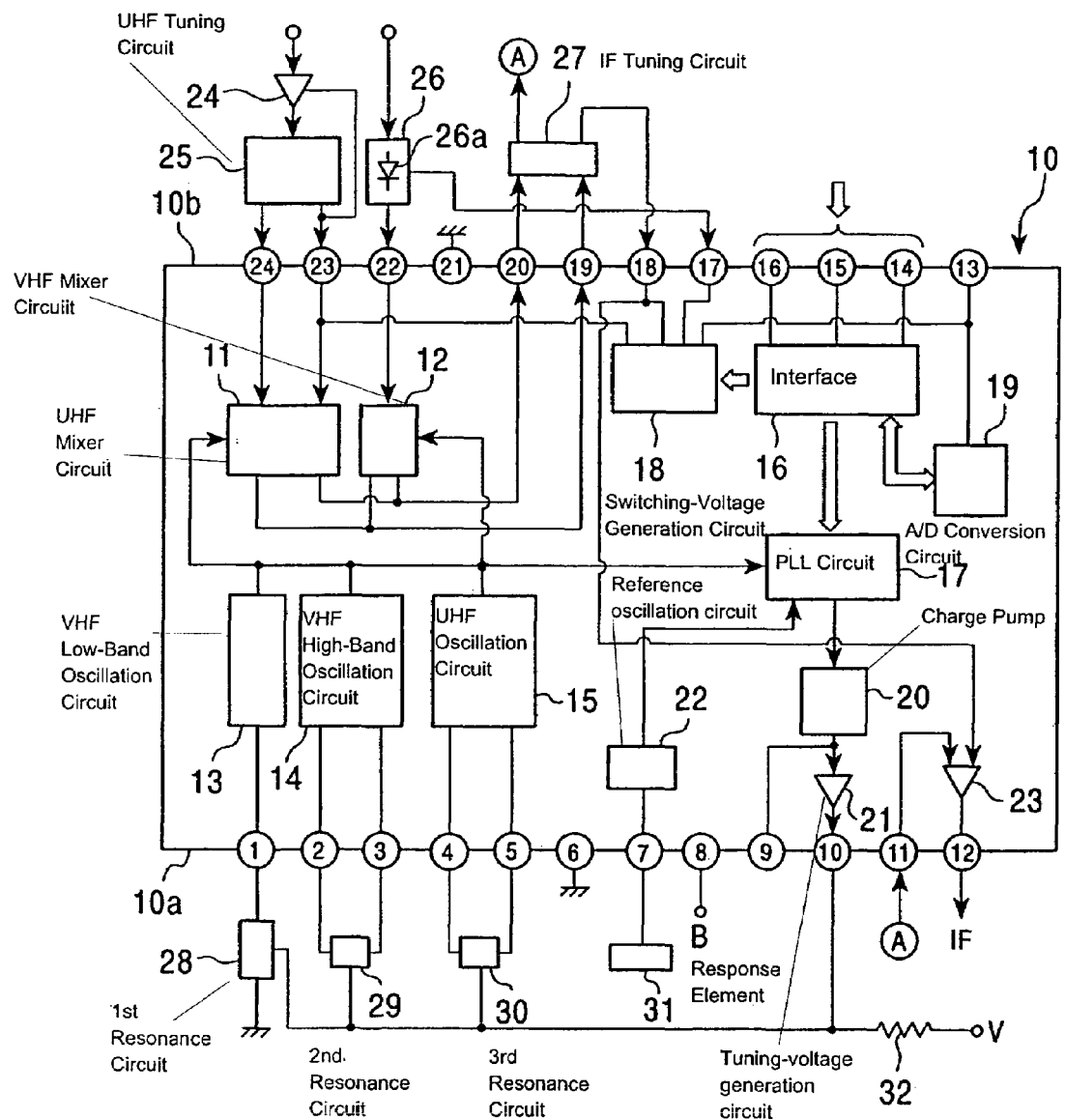
FIG. 1 is a block diagram showing the configuration of an integrated tuner circuit.

FIG. 1 shows one embodiment of an integrated tuner circuit (hereinafter referred to as an "integrated circuit") suitable for use in the tuner portion of a television unit. The tuner block receives a high-frequency television signal from an antenna cable input, or other source, and downconverts the high-frequency signal to an intermediate-frequency signal and/or to a baseband signal. As shown in FIG. 1, the integrated circuit 10 has 12 terminals on each of two opposing sides (numerals within white circles represent terminal numbers (No.)).

Terminals No. 1 through No. 12 are provided for one of the sides 10a, and terminals No. 13 through No. 24 are provided for the other side 10b. Inside the integrated circuit 10, a plurality of circuits are formed, as generally shown in FIG. 1. A balanced input end of a UHF mixer circuit 11 is connected to terminal No. 23 which is a first terminal, and terminal No. 24, and an unbalanced input end of a VHF mixer circuit 12 is connected to terminal No. 22. Furthermore, the balanced output ends of the mixer circuits 11 and 12 are connected to terminals 19 and 20.

A local oscillation signal is supplied to the VHF mixer circuit 12 from two oscillation circuits, that is, a VHF low-band oscillation circuit (hereinafter referred to as a "low-band oscillation circuit") 13 and a VHF high-band oscillation circuit (hereinafter referred to as a "high-band oscillation circuit") 14. The low-band oscillation circuit 13 is an unbalanced type, and the resonance-circuit coupling end thereof is connected to terminal No. 1 which is a third terminal. The high-band oscillation circuit 14 is a balanced type, and the two resonance-circuit coupling ends thereof are correspondingly connected to terminal No. 2 which is a fourth terminal and terminal No. 3 which is a fifth terminal. A local oscillation signal is supplied from a UHF oscillation circuit 15 to the UHF mixer circuit 11. The UHF oscillation circuit 15 is also a balanced type, and the two resonance-circuit coupling ends thereof are correspondingly connected to terminal No. 4 which is a sixth terminal and terminal No. 5 which is a seventh terminal.

Data for selecting a channel to be received is input to terminals No. 14 to No. 16 from the main unit of a television receiver (not shown). More specifically, data for selecting a channel, band-switching data, and so on are input to terminal No. 14, a clock signal is input to terminal No. 15, and address data is input to terminal No. 16. The above data is input to a PLL circuit 17 and a switching-voltage generation circuit 18 via an interface 16 An analog-to-digital conversion circuit (hereinafter referred to as an "A/D conversion circuit") 19 is connected to terminal No. 13 which is a tenth terminal. The A/D conversion circuit 19 transmits and receives data to and from the interface 16.

Receiving-channel selection data and the local oscillation signals output from the oscillation circuits 13, 14, and 15 are input to the PLL circuit 17. An error signal output from the PLL circuit 17 is DC-converted by a charge pump 20 having a low-pass filter, and then a tuning voltage is output to terminal No. 10 from a tuning-voltage generation circuit 21. Furthermore, a reference signal is input to the PLL circuit 17 from a reference oscillation circuit 22. A resonance element connection end of the reference oscillation circuit 22 is connected to terminal No. 7 which is an eleventh terminal.

The switching-voltage generation circuit 18 has therein a plurality of switching circuits, so that each switching circuit generates a high-level or low-level switching voltage in accordance with the input band-switching data. This switching voltage is used to switch the band to be received, and is output to a tenth terminal (No. 13), a second terminal (No. 17), a ninth terminal (No. 18), and the first terminal (No. 23).

An intermediate-frequency amplifying circuit 23 is formed as a balanced input type and an unbalanced output type, whereby one of the input ends thereof is connected to terminal No. 11, and the other input end is connected to terminal No. 18 which is an ninth terminal.

The terminals Nos. 6 and 21 are grounded, and a power-supply voltage B to be supplied to each circuit is applied to terminal No. 8.

Peripheral circuits which are externally provided are connected to the integrated circuit 10. A television signal of a UHF band is input in a balanced manner to the first terminal (No. 23) and terminal No. 24 after passing through a UHF high-frequency amplifying circuit 24 and a UHF tuning circuit 25. At this time, the UHF high-frequency amplifying circuit 24 is controlled to operate in accordance with a switching voltage that appears at the first terminal (No. 23). A television signal of a VHF band is input to terminal No. 22 after passing through a VHF tuning circuit 26. The VHF tuning circuit 26 comprises an input tuning circuit and an interstage tuning circuit, and has therein a switching diode 26a. The switching diode 26a is switched between the on and off states in accordance with the switching voltage output from the second terminal (No. 17), and in accordance with this switching, the VHF tuning circuit 26 is switched so as to tune to a low band or a high band of the VHF band. An intermediate-frequency tuning circuit 27 is a balanced type, whereby the input ends thereof are connected to terminals Nos. 19 and 20, one of the output ends is connected to the ninth terminal (No. 18), and the other output end is connected to terminal No. 11 (indicated by "A")

A first resonance circuit 28 is used when a low band of a VHF band is received, one end thereof is coupled to the third terminal (No. 1), and the other end is grounded. A second resonance circuit 29 is used when a high band of the VHF band is received, one end thereof is coupled to the fourth terminal (No. 2), and the other end is coupled to the fifth terminal (No. 3). Furthermore, a third resonance circuit 30 is used when the UHF band is received, one end thereof is coupled to the sixth terminal (No. 4), and the other end is coupled to the seventh terminal (No. 5). Each of the resonance circuits 28, 29, and 30 is provided with a varactor diode for changing the resonance frequency. A tuning voltage is applied to the varactor diode from terminal No. 10. A high voltage (higher than the maximum value of the tuning voltage) V is applied to terminal No. 10 via a pull-up resistor 32. A resonance element 31, such as a crystal resonator, is connected to an eleventh terminal (No. 7). Therefore, the low electrical-potential terminals Nos. 6 and 8, which are grounded at a high frequency, are disposed on both sides of the seventh terminal (No. 7) to which the resonance element 31 is connected, thereby obtaining the advantage that the radiation of the reference signal which appears at the eleventh terminal (No. 7) can be blocked by terminals Nos. 6 and 8.

In the above-described configuration, the television signal of the UHF band and the television signal of the VHF band are converted into intermediate-frequency signals by the UHF mixer circuit 11 and the VHF mixer circuit 12, respectively, and the intermediate-frequency signals are output in an unbalanced manner to the eighth terminal (No. 12) after passing through the intermediate-frequency tuning circuit 27 and the intermediate-frequency amplifying circuit 23. The output intermediate-frequency signal IF is processed by a demodulation circuit (not shown) and other components of a television unit to generate the TV picture.

Figure 2:
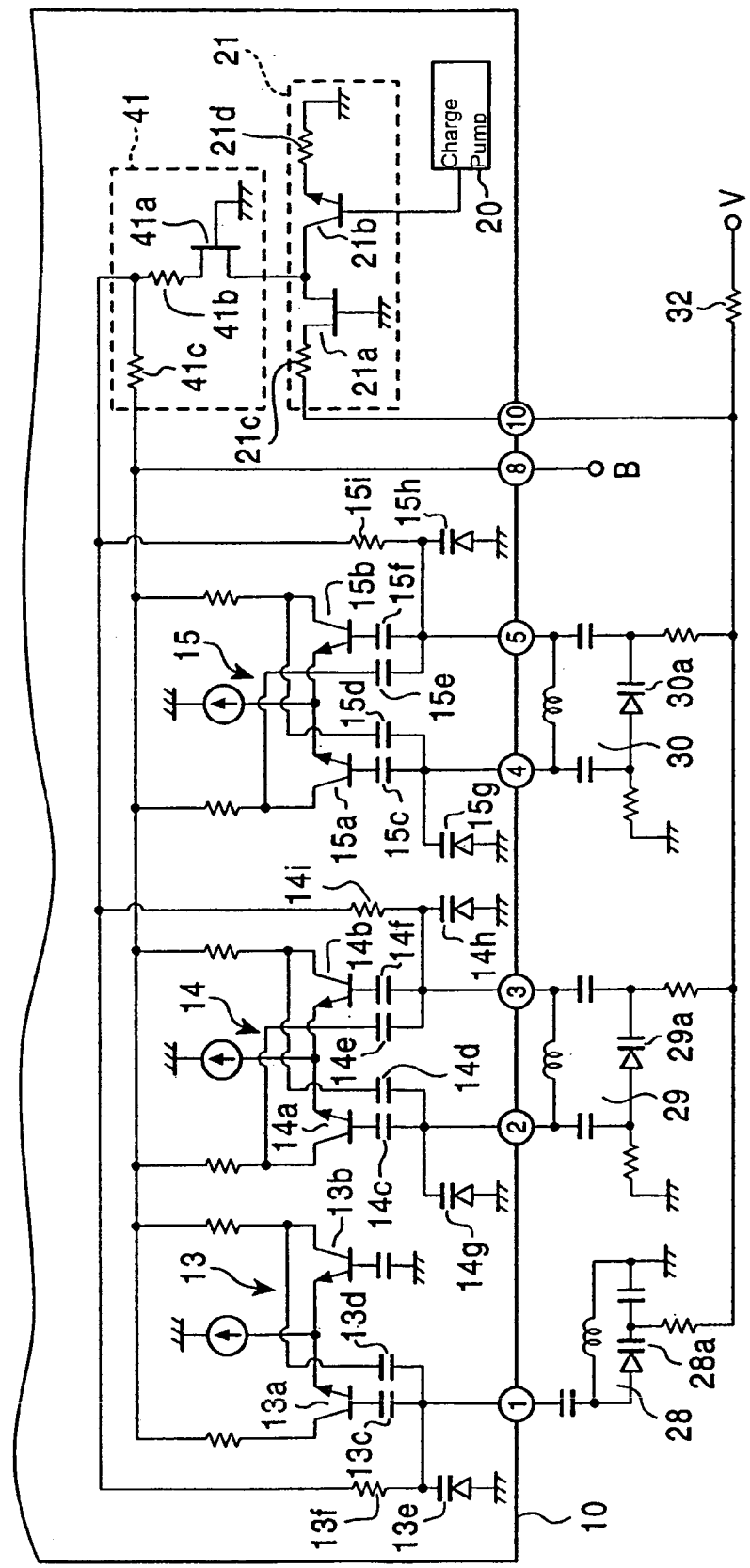
FIG. 2 is a detailed connection diagram showing an oscillation circuit and peripheral circuits in the integrated tuner circuit.

FIG. 2 illustrates examples of the oscillation circuits 13 to 15 and examples of the resonance circuits 28 to 30, and one version of their connection relationships with other related circuits. The low-band oscillation circuit 13 has two first differential oscillation transistors 13a and 13b, whose emitters are connected to each other. The base of one of the oscillation transistors 13a and the collector of the other oscillation transistor 13b form a resonance-circuit coupling end, and these are coupled to the third terminal (No. 1) via the corresponding coupling capacitors 13c and 13d. The base of the other oscillation transistor 13b is grounded at a high frequency. Furthermore, the cathode of a diode 13e is connected to the third terminal (No. 1), and the anode thereof is grounded.

The high-band oscillation circuit 14 also has two second differential oscillation transistors 14a and 14b, whose emitters are connected to each other. The base of one of the oscillation transistors 14a and the collector of the other oscillation transistor 14b form a resonance-circuit coupling end, and these are coupled to the fourth terminal (No. 2) via corresponding coupling capacitors 14c and 14d The base of the other oscillation transistor 14b and the collector of the one of the oscillation transistors 14a form the other resonance-circuit coupling end, and these are coupled to the fifth terminal (No. 3) via corresponding coupling capacitors 14f and 14e. The cathode of a diode 14g is connected to the fourth terminal (No. 2), and the anode thereof is grounded The cathode of a diode 14h is connected to the fifth terminal (No. 3) and the anode thereof is grounded.

The UHF oscillation circuit 15 also has two third differential oscillation transistors 15a and 15b, whose emitters are connected to each other. The base of one of the oscillation transistors 15a and the collector of the other oscillation transistor 15b form a resonance-circuit coupling end, and these are coupled to the sixth terminal (No. 4) via corresponding coupling capacitors 15c and 15d. The base of the other oscillation transistor 15b and the collector of the one of the oscillation transistors 15a form the other resonance-circuit coupling end, and these are coupled to the seventh terminal (No. 5) via corresponding coupling capacitors 15f and 15e. The cathode of a diode 15g is connected to the sixth terminal (No. 4), and the anode thereof is grounded. The cathode of a diode 15h is connected to the seventh terminal (No. 5), and the anode thereof is grounded.

As described above, since the resonance-circuit coupling end of each resonance circuit is connected to each terminal via the corresponding coupling capacitor, the number of terminals is greatly reduced.

The cathodes of the varactor diodes 28a, 29a, and 30a provided in the first resonance circuit 28, the second resonance circuit 29, and the third resonance circuit 30, respectively, are connected to terminal No. 10.

The tuning-voltage generation circuit 21 to which a DC voltage is input from the charge pump 20 has a junction FET 21a and an NPN transistor 21b. The drain of the junction FET 21a is connected to terminal No. 10 by a resistor 21c, and the source thereof is connected to the collector of the NPN transistor 21b. The junction FET 21a and the NPN transistor 21b function as a variable-resistor. The emitter of the NPN transistor 21b is grounded by a resistor 21d.

The ratio of the impedance of the tuning-voltage generation circuit 21 to the impedance of the pull-up resistor 32 varies in accordance with the voltage output from the charge pump 20, and a tuning voltage in a range of approximately 2 to 25 volts is generated at terminal No. 10. This voltage is applied to the varactor diodes 28a, 29a, and 30a.

A temperature-compensating circuit 41 (not shown in FIG. 1) is provided between the connection point of the junction FET 21a and the NPN transistor 21b and the cathodes of the diodes 13e, 14h, and 15h provided in the oscillation circuits 13, 14, and 15, respectively. The temperature-compensating circuit 41 is formed of a junction FET 41a, and two resistors 41b and 41c connected in series between the drain of the junction FET 41a and terminal No. 8, and the source of the junction FET 41a is connected to the collector of the NPN transistor 21b in the tuning-voltage generation circuit 21. The junction FET 41a functions as a variable-resistor. A voltage (here, referred to as a "temperature-compensating voltage") such that the power-supply voltage is divided appears at the connection point of the two resistors 41b and 41c. This voltage is applied to the cathodes of the diodes 13e, 14h, and 15h via resistors 13f, 14i, and 15i, respectively.

In the above-described configuration, the capacitance of each of the varactor diodes 28a, 29a, and 30a, and the diodes 13e, 14h, and 15h has a positive temperature coefficient. As the temperature increases, the capacitance increases. Therefore, the oscillation frequency changes to a lower oscillation frequency. Then, the voltage which is input to the NPN transistor 21b of the tuning-voltage generation circuit 21 from the charge pump 20 is decreased by the operation of the PLL circuit 17, the voltage between the collector and the emitter of the NPN transistor 21b is increased, and the tuning voltage which appears at terminal No. 10 is increased so that the oscillation frequency returns to normal. At this time, the voltage of the connection point of the two resistors 41b and 41c in the temperature-compensating circuit 41 is increased. Therefore, the voltage applied to the cathodes of the diodes 13e, 14h, and 15h becomes higher than that in a conventional case.

In general, since the capacitance across a diode is decreased as the inverse bias voltage is increased, the advantage arises in that the change in the oscillation frequency is also suppressed by each of the diodes 13e, 14h, and 15h. Therefore, the change in the tuning voltage for returning the changed oscillation frequency to normal is less required.

Figure 3:
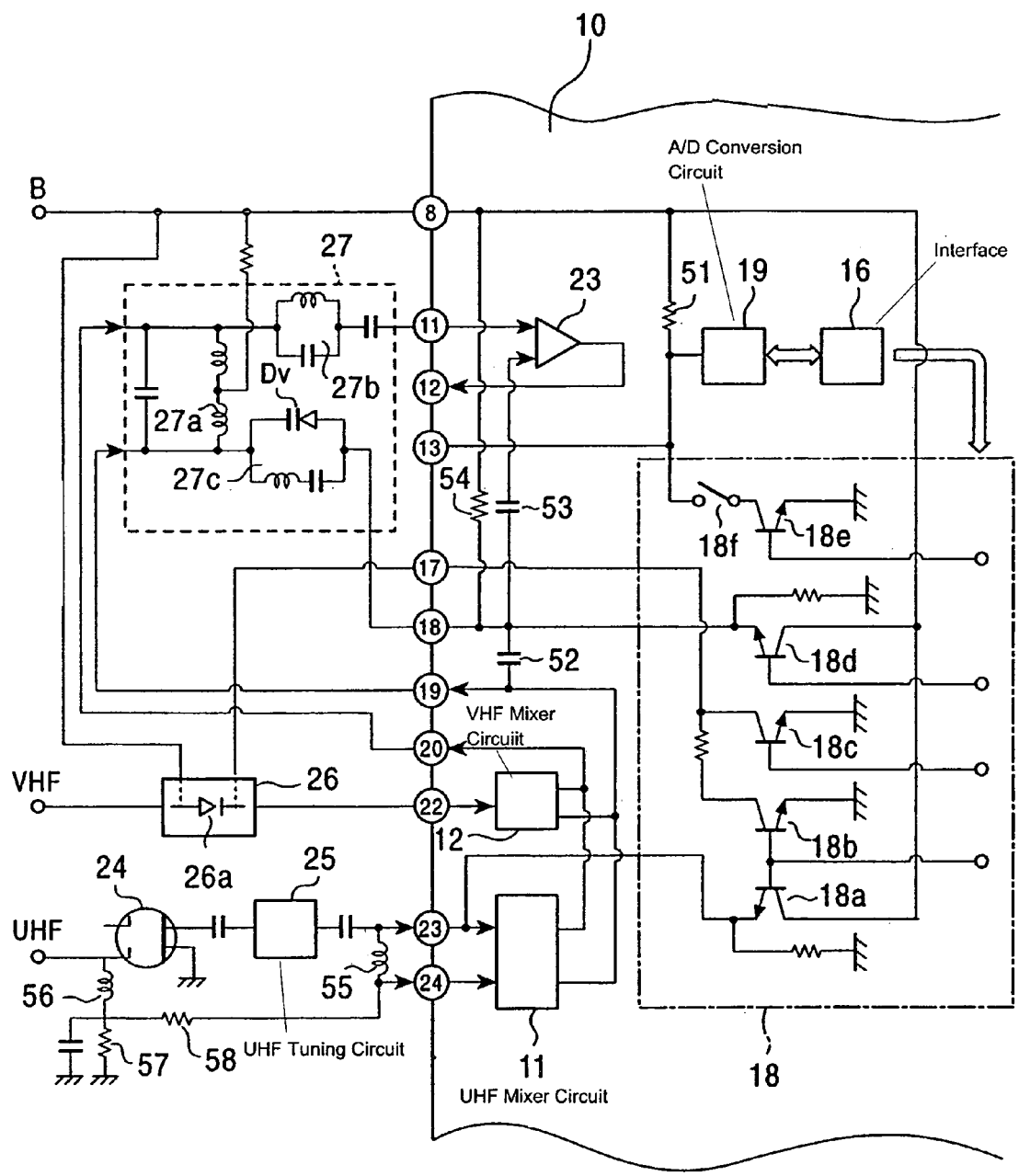
FIG. 3 is a detailed connection diagram showing a band-switching-voltage generation circuit and peripheral circuits in the integrated tuner circuit.
Figure 4:
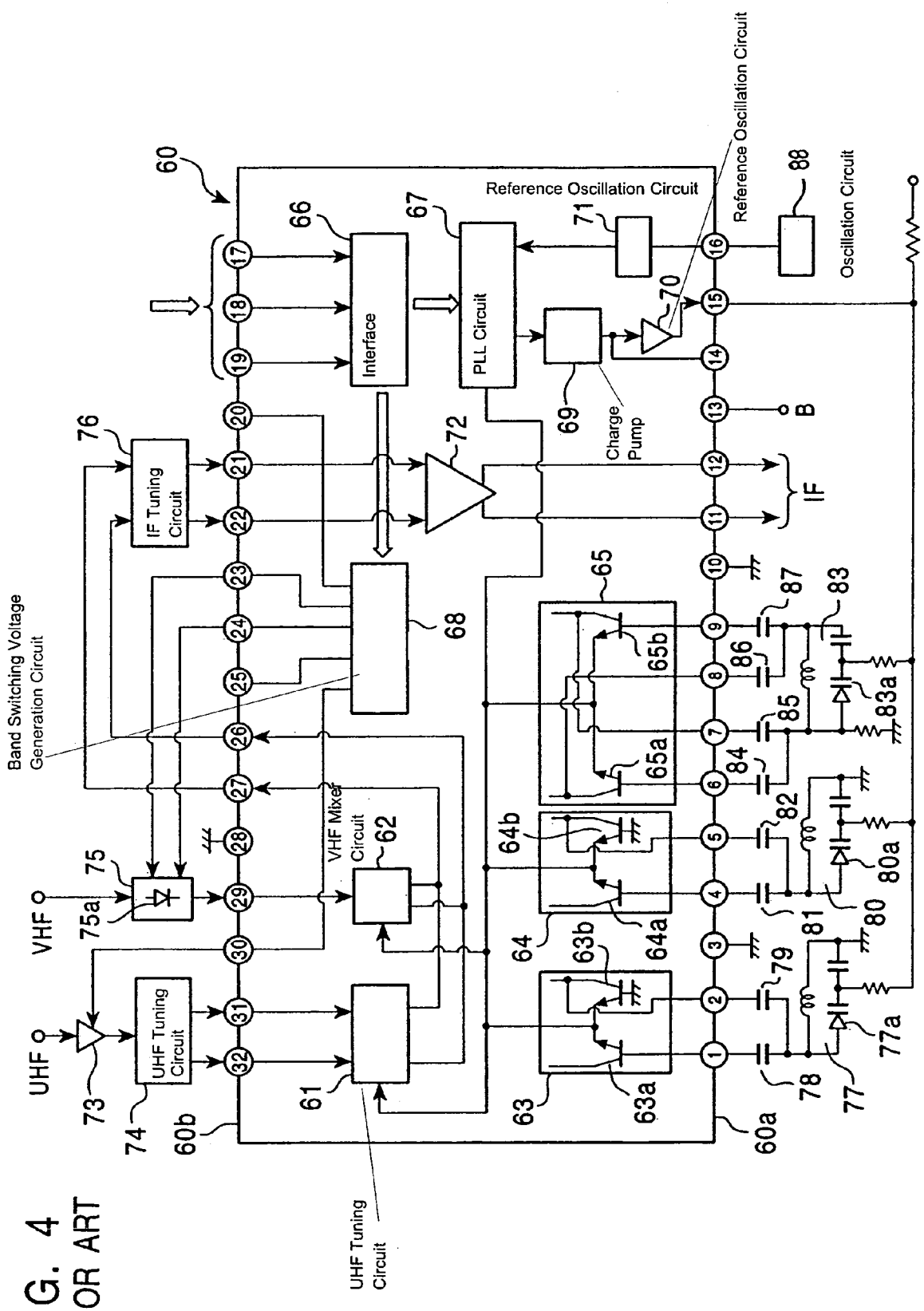
FIG. 4 is a block diagram showing the configuration of a conventional integrated tuner circuit.

FIG. 3 shows one configuration of connection relationships between the switching-voltage generation circuit 18 and other circuits to which the switching voltage is applied.

The switching-voltage generation circuit 18 within the integrated circuit 10 has therein switching circuits 18a to 18e formed of transistors (all are NPN transistors in this example). The emitter of the transistor in the first switching circuit 18a is connected to the first terminal (No. 23) and is grounded via a resistor. The base of the transistor 18b is connected to the base of the transistor in the first switching circuit 18a, the collector thereof is connected to the collector of the transistor in the second switching circuit 18c, and the emitter thereof is grounded.

The collector of the transistor in the second switching circuit 18c is connected to the second terminal (No. 17), and the emitter thereof is grounded. The emitter of the transistor in a third switching circuit 18d is connected to the ninth terminal (No. 18), and is grounded via a resistor. The collector of the transistor in a fourth switching circuit 18e is connected to the tenth terminal (No. 13) via opening/closing unit 18f, and the emitter thereof is grounded. In one configuration, the opening/closing unit 18f is formed by another switching transistor. The collector in each transistor in each of the switching circuits 18a and 18d is connected to terminal No. 8. An on/off control signal is input to each base from the interface 16. The opening/closing of the opening/closing unit 18f is controlled by the interface 16.

Next, a power-supply voltage is supplied to the A/D conversion circuit 19 from terminal No. 8 via a resistor 51, and the tenth terminal (No. 13) is connected to terminal No. 8 via this resistor 51. The operation/non-operation of the A/D conversion circuit 19 is controlled by the interface 16. The ninth terminal (No. 18) and terminal No. 19 are connected to each other by a capacitor 52. A DC-blocking capacitor 53 is interposed between terminal No. 18 and the other input end of the intermediate-frequency amplifying circuit 23. Furthermore, a power-supply voltage is supplied to the ninth terminal (No. 18) from terminal No. 8 via a resistor 54.

The UHF high-frequency amplifying circuit 24 is formed of at least one FET (Field-Effect Transistor), and a television signal of a UHF band is input to a first gate of the FET. The amplified television signal is input to the first terminal (No. 23) after passing through the UHF tuning circuit 25, and also, is input to terminal No. 24 via an inductance element 55 for inverting the phase. Therefore, a television signal is input in a balanced manner between the first terminal (No. 23) and terminal No. 24. One end of a resonance inductance element 56 is connected to the first gate, and the other end is grounded by a resistor 57. A connection point of the resonance inductance element 56 and the resistor 57 is connected to terminal No. 24 by a resistor 58.

A power-supply voltage is supplied to the anode of a switching diode 26a within the VHF tuning circuit 26, and the cathode thereof is DC-connected to the second terminal (No. 17).

The intermediate-frequency tuning circuit 27 has a parallel tuning circuit 27a, to both ends of which an intermediate-frequency signal is input from terminals Nos. 19 and 20, a first trapping circuit 27b interposed between one end of the parallel tuning circuit 27a and terminal No. 11, and a second trapping circuit 27c interposed between the other end and the ninth terminal (No. 18). The second trapping circuit 27c is provided with a varactor diode Dv, and a power-supply voltage is applied to the cathode thereof. The anode thereof is connected to the ninth terminal (No. 18). As a result, capacitor 52 is connected in parallel to the varactor diode Dv within the second trapping circuit 27c. The trapping circuits 27b and 27c attenuate a video intermediate signal of one of adjacent channels in the intermediate-frequency band, and attenuate an audio intermediate-frequency signal of the other adjacent channel.

In the above-described configuration, when a television signal of a VHF band is to be received, the transistors of the first to third switching circuits 18a, 18b, and 18c are turned off. Then, the switching voltage of the first terminal (No. 23) reaches a low level, and since a bias voltage is not applied to the first gate, the UHF high-frequency amplifying circuit 24 does not operate. On the other hand, since the switching voltage of the second terminal (No. 17) reaches a high level, the switching diode 26a is turned off, and the VHF tuning circuit 26 tunes to a low band. When a television signal of a high band is to be received, the transistor of the first switching circuit 18a and the transistor 18b are turned off, and the transistor of the second switching circuit 18c is turned on. Then, the switching voltage of the second terminal (No. 17) reaches a low level, and since the switching diode 26a is turned on, the VHF tuning circuit 26 tunes to a high band. When a television signal of a UHF band is to be received, the transistor of the first switching circuit 18a and the transistor 18b are turned on, and the transistor of the second switching circuit 18c is turned off. Just then, the switching voltage of the first terminal (No. 23) reaches a high level, and the UHF high-frequency amplifying circuit 24 operates as a result of a bias voltage being applied to the first gate.

As a result, the first terminal (No. 23) is commonly used as not only the input terminal for a television signal of a UHF band, but also as an output terminal for a switching voltage for the first switching circuit 18a used to switch the operation of the UHF high-frequency amplifying circuit 24.

Furthermore, the tuning frequency band of the VHF tuning circuit 26 can be switched by only the switching voltage of the second terminal (No. 17).

Therefore, the number of terminals which output a switching voltage used to switch the receiving band can be reduced.

On the other hand, the switching voltage of the ninth terminal (No. 18) changes to a high level or a low level in accordance with the on or off state of the transistor in the third switching circuit 18d. In correspondence with the change, the capacitance of the varactor diode Dv in the second trapping circuit 27c varies, and the trapping frequency varies to a higher or lower trapping frequency. Therefore, it is possible to select an appropriate trapping frequency in such a manner as to correspond to a television signal of two methods in which the differences between the video intermediate frequency and the audio intermediate frequency differ. Therefore, since the ninth terminal (No. 18) to which the intermediate-frequency signal is input can be used as a switching-voltage output terminal of the third switching circuit 18d, the trapping frequency can be varied even if the number of terminals is not increased.

When the opening/closing unit 18f is closed, the switching voltage of the fourth switching circuit 18e can be output to the tenth terminal (No 13). If the opening/closing unit 18f is opened and an analog voltage such as an AFT (Automatic Fine Tuning) voltage is input to the tenth terminal (No. 13), a digital signal can be output from the A/D conversion circuit 19 and can be sent to the interface 16. The digital signal is sent from the interface 16 to the PLL circuit 17, whereby the oscillation frequency of each of the oscillation circuits 13, 14, and 15 is controlled by the PLL circuit 17.

Therefore, the tenth terminal (No. 13) can be commonly used as not only the input terminal for the analog voltage, but also as an output terminal for the switching voltage of the fourth switching circuit 18e.

Figure 5:
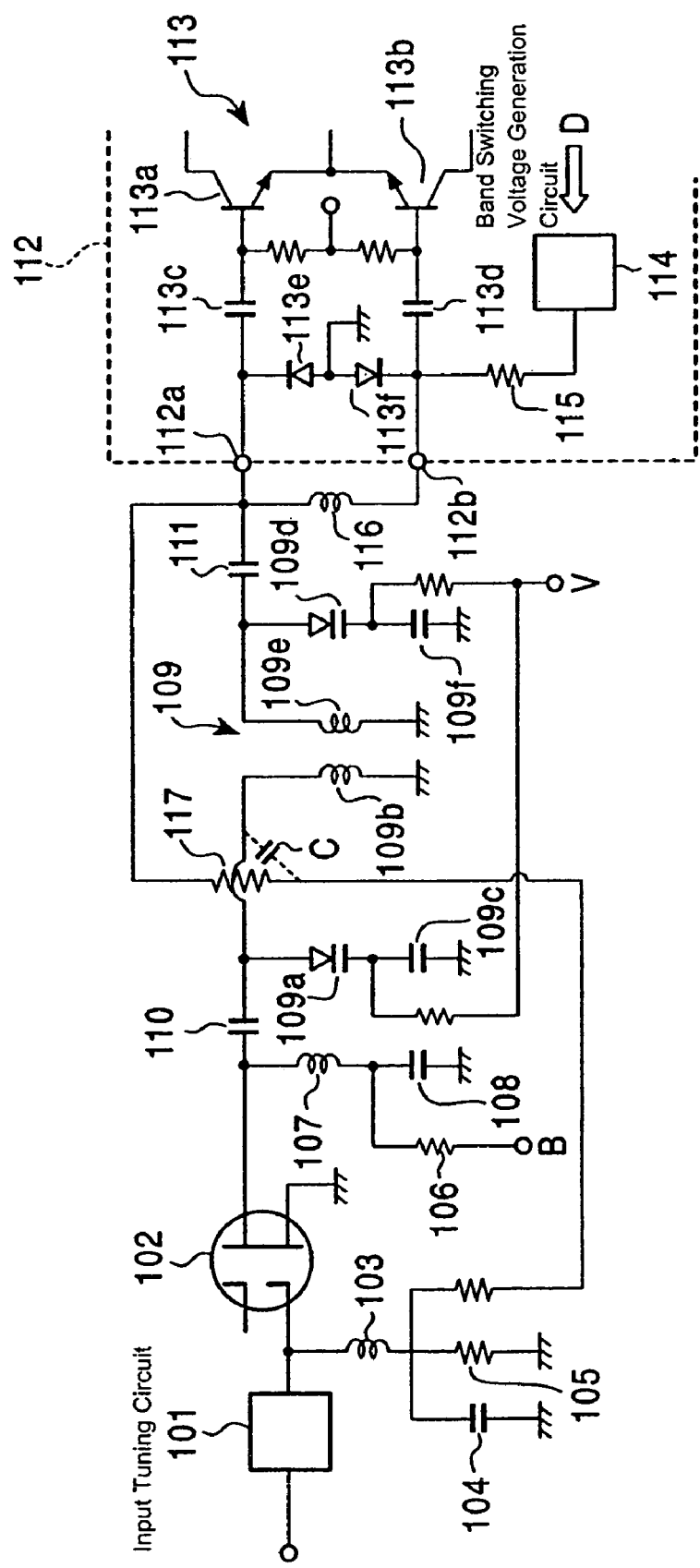
FIG. 5 is a circuit-diagram showing the configuration of an integrated tuner circuit and a television tuner using the integrated tuner circuit.
Figure 6:
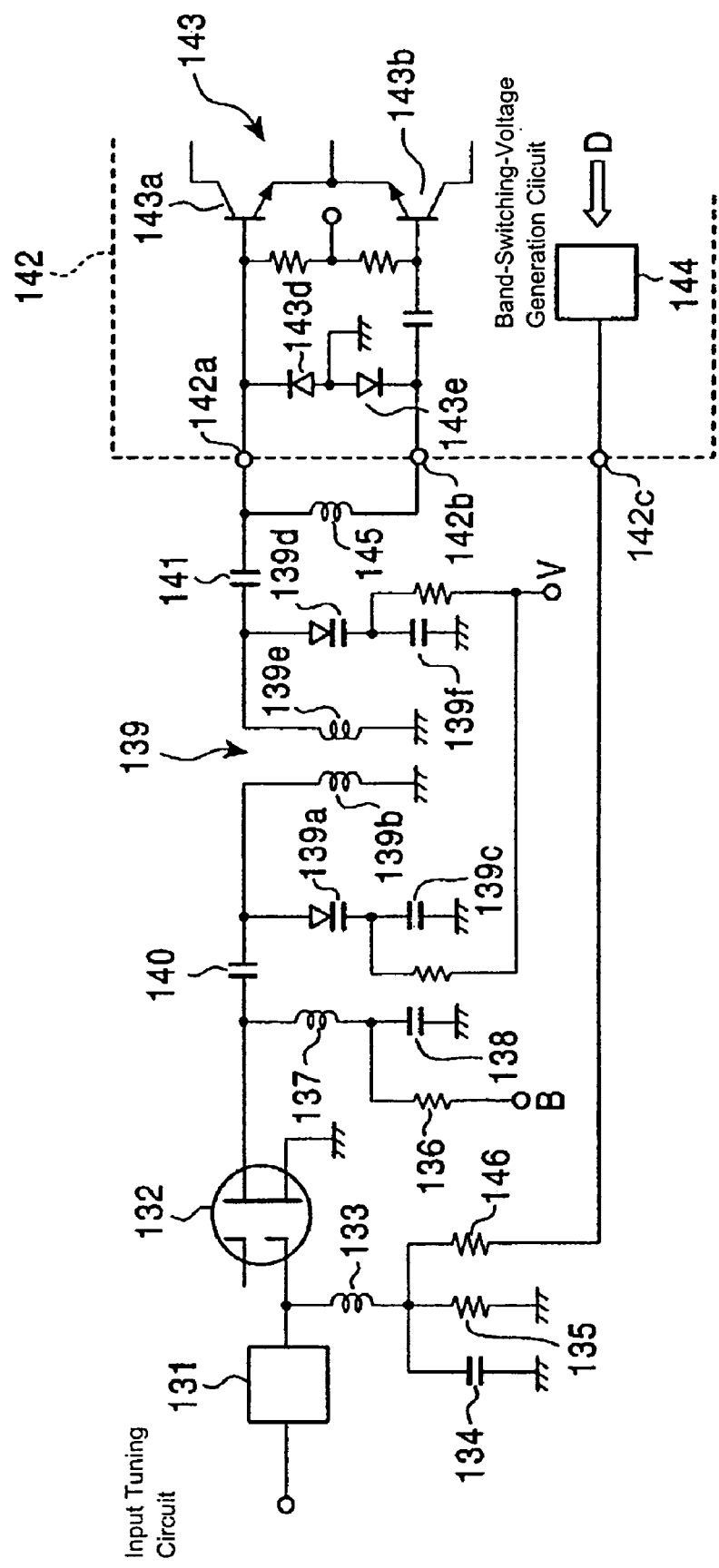
FIG. 6 is a circuit diagram showing the configuration of a conventional integrated tuner circuit and a television tuner using the integrated tuner circuit.

FIG. 5 shows one implementation of a television tuner to which, in particular, a television signal of a UHF band is input. An input tuning circuit 101 to which a television signal is input has a varactor diode (not shown), and a tuning voltage V is applied to the varactor diode. An FET (dual-gate FET) 102 which is a constituent of a high-frequency amplifying circuit is provided in a portion subsequent to the input tuning circuit 101, and the output end of the input tuning circuit 101 is coupled to the first gate of the FET 102. One end of an inductance element 103 is connected to the first gate of the FET 102, the other end is grounded at a high frequency by a DC-blocking capacitor 104 and is grounded by a bias resistor 105. The source thereof is grounded, and a power-supply voltage B is applied to the drain thereof via a series circuit of a power-feeding resistor 106 and a choke inductor 107. The connection point of the power-feeding resistor 106 and the choke inductor 107 is grounded by a DC-blocking capacitor 108.

A double tuning circuit 109, which is an interstage tuning circuit, is provided at the next stage of the FET 102. A parallel tuning circuit on the primary side thereof is formed of a varactor diode 109a and an inductance element 109b, and the connection point of the anode of the varactor diode 109a and the inductance element 109b, which is a high electrical-potential point, is coupled to the drain of the FET 102 via a coupling capacitor 110. The cathode of the varactor diode 109a is grounded by a DC-blocking capacitor 109c, and the other end of the inductance element 109b is also grounded. A tuning voltage V is applied to the cathode of the varactor diode 109a.

A parallel tuning circuit on the secondary side in the double tuning circuit 109 is formed of a varactor diode 109d and an inductance element 109e, and the connection point of the anode of the varactor diode 109d and the inductance element 109e, which is a high electrical-potential point, is coupled to a first terminal 112a of an integrated tuner circuit (hereinafter referred to simply as an "integrated circuit") 112 via a coupling capacitor 111. The cathode of the varactor diode 109d is grounded by a DC-blocking capacitor 109f, and the other end of the inductance element 109e is also grounded. A tuning voltage V is applied to the cathode of the varactor diode 109d.

A mixer circuit 113 for converting the frequency is formed inside the integrated circuit 112. The mixer circuit 113 is formed as a balanced type. The mixer circuit 113 has two transistors 113a and 113b, whose emitters are connected to each other, the base of one of the transistors 113a is coupled to the first terminal 112a by a capacitor 113c, and the base of the other transistor 113b is coupled to a second terminal 112b by a capacitor 113d. The capacitors 113c and 113d are formed inside the integrated circuit 112. A bias voltage is applied to the bases of the two transistors 113a and 113b inside the integrated circuit 112. Diodes 113e and 113f for preventing electrostatic breakdown, formed in the integrated circuit 112, are connected to the corresponding bases.

A band-switching-voltage generation circuit 114 is formed inside the integrated circuit 112. Data D for a channel to be received is input to the band-switching-voltage generation circuit 114, and based on the data, a high (approximately equal to the power-supply voltage B) or low (approximately 0 volts or an open state) switching voltage for selecting the band to which that channel belongs is generated. The switching voltage reaches a high level when, for example, a television signal of a channel of a. UHF band, which is a high frequency band, is to be received, and the switching voltage reaches a low level when a television signal of a channel of a VHF band, which is a low frequency band, is to be received. The output end of the band-switching-voltage generation circuit 114 is connected to the second terminal 112b via a resistor 115.

The first terminal 112a and the second terminal 112b are connected to each other by an inductance element 116 for inverting the phase, provided outside the integrated circuit 112. Furthermore, the first terminal 112a is connected to the connection point of the inductance element 103 and the bias resistor 105 by a resistor 117. In this case, the resistor 117 is provided near so that a stray capacitance C is formed in a portion adjoining to the high electrical-potential point of the tuning circuit on the primary side in the double tuning circuit 109. When the signal line of the high electrical-potential point and the resistor 117 are arranged so that these intersect at right angles to each other, this is advantageous for forming the stray capacitance, and the arrangement form may be selected appropriately.

Since the stray capacitance and the two inductance elements 109a and 109e of the double tuning circuit 109 described above form a parallel resonance circuit, this becomes a trapping circuit, and an unwanted signal can be attenuated.

The tuning voltage V applied to the input tuning circuit 101 and the double tuning circuit 109 are preferably generated by the integrated circuit 112.

In the above-described configuration, when a television signal of a UHF band is to be received, the switching voltage reaches a high level, an appropriate bias voltage is applied to the first gate of the FET 102, and the FET 102 operates normally. Then, the television signal is amplified by the FET 102, is selected by the double tuning circuit 109, is converted in a balanced manner by the inductance element 116, and is input to the first terminal 112a and the second terminal 112b of the integrated circuit 112. The switching voltage, together with the television signal is superposed on the first terminal 112a and the second terminal 112b. However, this does not affect the reception of a television signal.

When a television signal of a VHF band is to be received, the switching voltage becomes low, a bias voltage is not applied to the first gate of the FET 102, and the FET 102 is placed in a non-operating state.

What is claimed is:

1. An integrated tuner circuit comprising:
    a switching-voltage generation circuit;
    a first terminal to which a television signal of a UHF band is input via an external UHF high-frequency amplifying circuit that is switched to an operating state when at least a television signal of a UHF band is received; and
    a second terminal for switching an external VHF tuning circuit to select between a low band and a high band of a VHF band,
    wherein said switching-voltage generation circuit comprises a first switching circuit for generating a switching voltage used to switch the operating state of said UHF high-frequency amplifying circuit, and a second switching circuit for generating a switching voltage used to switch said VHF tuning circuit, and
    wherein the switching voltage of said first switching circuit is output to said first terminal, and the switching voltage of said second switching circuit is output to said second terminal.

2. An integrated tuner circuit according to claim 1, further comprising:
    two first oscillation transistors whose emitters are connected to each other;
    two second oscillation transistors whose emitters are connected to each other;
    two third oscillation transistors whose emitters are connected to each other;
    a third terminal to which one end of an external first resonance circuit is connected;
    fourth and fifth terminals to which the two ends of an external second resonance circuit are correspondingly connected; and sixth and seventh terminals to which the two ends of an external third resonance circuit are correspondingly connected, wherein the base of one of said two first oscillation transistors and the collector of the other first oscillation transistor are coupled to said third terminal by corresponding coupling capacitors, the base of one of said two second oscillation transistors and the collector of the other second oscillation transistor are coupled to said fourth terminal by corresponding coupling capacitors, the base of said other second oscillation transistor and the collector of one of said two second oscillation transistors are coupled to said fifth terminal by corresponding coupling capacitors, the base of one of said two third oscillation transistors and the collector of the other third oscillation transistor are coupled to said sixth terminal by corresponding coupling capacitors, and the base of said other second oscillation transistor and the collector of the one of the two second oscillation transistors are coupled to said seventh terminal by corresponding coupling capacitors.

3. An integrated tuner circuit according to claim 1, further comprising:
an intermediate-frequency amplifying circuit; and
an eighth terminal for outputting an intermediate-frequency signal,
wherein said intermediate-frequency amplifying circuit is formed as a balanced input type and an unbalanced output type, and an output end of said intermediate-frequency amplifying circuit is connected to said eighth terminal.

4. An integrated tuner circuit according to claim 1, further comprising:
a ninth terminal to which a balanced output end of an external intermediate-frequency tuning circuit is connected,
wherein said intermediate-frequency tuning circuit comprises a trapping circuit for attenuating a video intermediate-frequency signal or an audio intermediate-frequency signal of an adjacent channel and is configured so that the trapping frequency of said trapping circuit is adjustable, said switching-voltage generation circuit comprises a third switching circuit for generating a switching voltage used to change said trapping frequency, and the switching voltage of said third switching circuit is output to said ninth terminal.

5. An integrated tuner circuit according to claim 1, further comprising:
an analog-to-digital conversion circuit; and
a tenth terminal for inputting an analog signal to said analog-to-digital conversion circuit,
wherein said switching-voltage generation circuit comprises a fourth switching circuit for outputting a high-level or a low-level voltage, and opening/closing means interposed between said tenth terminal and said fourth switching circuit,
wherein said opening/closing means is opened when said analog-to-digital conversion circuit is made to operate, and said opening/closing means is closed when said fourth switching circuit is made to operate.

6. An integrated tuner circuit according to claim 1, further comprising:
a PLL circuit;
a reference oscillation circuit for supplying a reference signal to said PLL circuit; and an eleventh terminal by which an oscillation element which is externally provided is connected to said reference oscillation circuit,
wherein terminals which reach a low electrical potential at a high frequency are provided on both sides of said eleventh terminal.

7. An integrated tuner circuit comprising:
a mixer circuit for converting a television signal into an intermediate-frequency signal;
one ore more terminals to which said television signal is input; and
a band-switching-voltage generation circuit for generating a high or a low switching voltage for receiving a high-frequency or low-frequency television signal,
wherein an input end of said mixer circuit is connected at a high frequency to said terminal, and said switching voltage is applied to said terminal via a resistor.

8. An integrated tuner circuit according to claim 7, wherein said mixer circuit comprises two transistors formed as a balanced type in which the bases are input ends, the one or more terminals includes a first terminal and a second terminal, the bases of said transistors are connected to said terminals via corresponding capacitor elements, and said switching voltage is applied to one of said terminals.

9. A television tuner comprising:
an integrated tuner circuit according to claim 7;
an amplifying field-effect transistor, to the gate of which a television signal is input; and
a tuning circuit connected to the drain of said field-effect transistor,
wherein an output end of said tuning circuit is coupled to said first terminal of said integrated tuner circuit, and said gate is DC-connected to said first terminal.

10. A television tuner comprising:
an integrated tuner circuit according to claim 8;
an amplifying field-effect transistor, to the gate of which a television signal is input; and
a tuning circuit connected to the drain of said field-effect transistor,
wherein an output end of said tuning circuit is coupled to the second terminal of said integrated tuner circuit, said first and second terminals are interconnected by an inductance element, and said gate is DC-connected to said first terminal.

11. A television tuner according to claim 10, wherein said tuning circuit comprises a double tuning circuit, said gate and said second terminal are connected to each other by a resistor, and a stray capacitance is formed between said resistor and the high electrical-potential side of the tuning circuit on a primary side in said double tuning circuit.

12. A television tuner comprising:
a band-specific tuning circuit configured to receive a TV signal in a specific frequency band;
an integrated circuit comprising:
a first terminal electrically coupled to the band-specific tuning circuit;
a band-selecting circuit electrically coupled to the first terminal and configured to provide a band-selection signal to the band-specific tuning circuit through the first terminal; and
a mixer circuit electrically coupled to the first terminal and configured to receive the TV signal though the first terminal.

13. The television tuner of claim 12, wherein the band-specific tuning circuit further comprises:

a switch electrically coupled to the first terminal and configured to receive the band-selection signal from the first terminal;

wherein the switch is configured to selectively transmit the TV signal in response to a transmit state of the band-selection signal;

wherein the switch is configured to selectively block the TV signal in response to a disconnect state of the band-selection signal.

14. The television tuner of claim 13, wherein the switch comprises a FET, wherein the band-selection signal is a voltage signal provided to a first gate of the FET, wherein the transmit state of the band-selection signal is an operating bias voltage of the FET.

15. The television tuner of claim 13, wherein the switch comprises a switching diode.

16. The television tuner of claim 13, wherein the band-specific tuning circuit further comprises:

an inductive component; and a resistive component electrically coupled to the first terminal and to the switching component;

wherein the resistive component is disposed proximate to the inductive component so that a capacitive coupling exists between therebetween;

wherein the capacitive coupling beneficially modifies operation of the band-specific tuning circuit.

17. A television comprising:

a TV-signal input;

a tuner unit coupled to the TV-signal input, configured to receive a broadcast-frequency signal therefrom, and configured to generate an intermediate-frequency signal in response to the broadcast-frequency signal; and a display unit coupled to the tuner unit and configured to display video in response to the intermediate-frequency signal;

wherein the tuner unit comprises:

a tuner integrated circuit coupled to the TV-signal input; and at least one adjustable resonance circuit coupled to the tuner integrated circuit;

wherein the tuner integrated circuit comprises:

a terminal coupled to the adjustable resonance circuit;

an oscillation circuit comprising a first transistor and a second transistor;

a first capacitor mounted on the tuner integrated circuit and connecting the first transistor to the terminal; and a second capacitor mounted on the tuner integrated circuit and connecting the second transistor to the terminal.

18. A television comprising:

a TV-signal input;

a temperature-stabilized tuner unit coupled to the TV-signal input, configured to receive a broadcast-frequency signal therefrom, and configured to generate an intermediate-frequency signal in response to the broadcast-frequency signal; and a display unit coupled to the tuner unit and configured to display video in response to the intermediate-frequency signal;

wherein the temperature-stabilized tuner unit comprises:

an adjustable resonance circuit configured to oscillate at a resonance frequency controllable by an error signal;

an oscillation circuit coupled to the adjustable resonance circuit and configured to generate a local oscillation signal;

a PLL coupled to the adjustable resonance circuit and to the oscillation circuit and configured to generate the error signal in response to the oscillation signal;

a temperature compensation circuit coupled to the PLL and configured to generate a temperature-compensating signal in response to the error signal; and an adjustable capacitive component coupled to the temperature compensation circuit and to the adjustable resonance circuit, wherein a capacitance of the adjustable capacitive component is controlled by the temperature-compensating signal, and wherein the capacitance of the adjustable capacitive component influences the resonance frequency of the adjustable resonance circuit.

19. The television of claim 18, wherein the temperature-stabilized tuner unit further comprises an integrated circuit;

wherein the oscillation circuit, the PLL, the temperature compensation circuit, and the adjustable capacitive component are formed in the integrated circuit, and wherein the adjustable resonance circuit is coupled to the integrated circuit.

20. The television of claim 18, wherein the adjustable capacitive component is a diode.

21. The television of claim 18, wherein the adjustable capacitive component is a varactor diode.

* * * * *